United States Patent [19]

Nakagawa

[11] 4,419,581

[45] Dec. 6, 1983

[54] MAGNETIC OBJECTIVE LENS FOR USE IN A SCANNING ELECTRON MICROSCOPE

[75] Inventor: Seiichi Nakagawa, Akishimashi, Japan

[73] Assignee: JEOL Ltd., Tokyo, Japan

[21] Appl. No.: 338,622

[22] Filed: Jan. 11, 1982

[51] Int. Cl.³ .............................................. H01J 37/14
[52] U.S. Cl. ............................................. 250/396 ML
[58] Field of Search .......................... 250/396 ML, 311

[56] References Cited

U.S. PATENT DOCUMENTS

| | | | |
|---|---|---|---|
| 4,214,162 | 7/1980 | Hoppe et al. | 250/396 ML |
| 4,219,732 | 8/1980 | Nakagawa et al. | 250/396 ML |
| 4,384,208 | 5/1983 | Tsuno | 250/396 ML |

FOREIGN PATENT DOCUMENTS 55-144639 11/1980 Japan ........................... 250/396 ML Primary Examiner—Craig E. Church
Assistant Examiner—T. N. Grigsby
Attorney, Agent, or Firm—Webb, Burden, Robinson & Webb

[57] ABSTRACT

In a scanning electron microscope, an objective lens has upper, lower and outer magnetic pole pieces. The bore diameter of the lower magnetic pole piece is smaller than those of said upper and outer magnetic pole pieces. The lens field between said upper and lower magnetic pole pieces is generated for observing a bulk specimen positioned at a long working distance. The lens field between said lower and outer magnetic pole pieces is generated for obtaining a high resolution image of a specimen.

3 Claims, 6 Drawing Figures

MAGNETIC OBJECTIVE LENS FOR USE IN A SCANNING ELECTRON MICROSCOPE

BACKGROUND OF THE INVENTION

This invention relates to a magnetic objective lens for use in a scanning electron microscope in which the working distance is largely varied.

In a conventional scanning electron microscope, a magnetic objective lens shown in FIG. 1 is incorporated. In the figure, the objective lens 1 comprises an excitation coil 2 wound around a lens axis 3, yokes 4 and 5 housing said excitation coil 2, an upper magnetic pole piece 6 attached to the annular end of the yoke 4, and a lower magnetic pole piece 7 attached to the annular end of the yoke 5. The magnetic field, which is symmetrical with respect to the axis 3, is formed between the upper and lower magnetic pole pieces 6 and 7 for converging the electron beam 8 from an electron gun (not shown) along the axis 3 on the surface of a specimen 9. The bore diameter D1 of the lower magnetic pole piece 7 is smaller than the bore diameter D2 of the upper magnetic pole piece 6, so that the strong magnetic field of the objective lens does not extend to the specimen. Position of the specimen 9 on a specimen stage 10 is varied by handling the specimen stage 10. The working distance W.D. (i.e., distance between the lower surface of the lower magnetic pole piece 7 and the specimen surface) is also varied by handling the specimen stage 10.

In ordinary observation using the scanning electron microscope, the W.D. is set at a comparatively long distance because of the following reasons.

(i) Deep "depth of focus length" due to long focal length of the objective lens is obtained, so that the scanning image of the uneven surface of a bulk specimen is observed clearly.

(ii) High takoff angle $\theta$ in the detection of the X-ray 11 radiating from the specimen 9 is obtained under condition of long W.D., so that the accurate X-ray measurement is possible.

(iii) Observation of a ferromagnetic specimen which should not be subject to a strong magnetic field becomes possible, because the lens magnetic field extended at the specimen positioned at long W.D. is quite weak.

On the other hand, in order to obtain a high resolution image, the diameter of the electron beam irradiating the specimen must be maximally reduced through the medium of the incorporated magnetic lens system. In conventional scanning electron microscopes, the main factor which hinders the reduction of the electron beam diameter is theoretically and practically a spherical aberration of the objective lens. Further, a chromatic aberration of the objective lens becomes a non-negligible factor as compared with said spherical aberration in a special observation case (particularly in the condition of the very short focal length of the objective lens). Quantity of said spherical aberration is proportional to $Cs \cdot \alpha^6$ where Cs is a spherical aberration coefficient and $\alpha$ is the semi-angle of the electron beam subtended by the objective lens at the converged spot on the specimen. An amount of chromatic aberration is proportional to $Cc \cdot \alpha^2$ where Cc is a chromatic aberration coefficient.

From the above, in order to reduce the diameter of the electron beam and thereby increase the resolution of the image, it is necessary to provide an objective lens having a small spherical aberration coefficient. And it is essential to shorten the objective lens focal length which is roughly proportional to the spherical and chromatic aberration coefficients. In other words, to minimize the spherical aberration in the objective lens, the W.D. corresponding to the focal length must become extremely short. In observation under the condition of short W.D., however, the above advantages (i), (ii) and (iii) are not ensured, and the value of the spherical aberration coefficient is not yet adequately reduced.

In order to obtain a higher resolution scanning image, there has been proposed an apparatus in which a specimen is placed in the gap between the magnetic pole pieces, as shown in the broken line 9', and the objective lens is strongly excited for the short focal length so as to attain a small spherical aberration coefficient. The proposed apparatus is, however, disadvantageous in that since the specimen is confined in a small space, a limitation is placed on the size of the specimen to be inserted through a side hole (not shown) of the lower pole piece, and it is difficult to effect desirable position control (for shift, rotation and inclination) for the specimen.

SUMMARY OF THE INVENTION

The main object of this invention is to provide an objective lens having a small spherical aberration coefficient without restriction of specimen size and specimen position control.

Another object of the invention is to provide an objective lens for reducing the extended lens magnetic field below the lower pole piece of the objective lens for observation of a ferromagnetic specimen.

These and other objects are achieved by providing upper, lower and outer magnetic pole pieces between which the lens magnetic field is generated by exciting one of the two excitation coils independently.

DETAILED DESCRIPTION OF THE INVENTION

Figure 1:
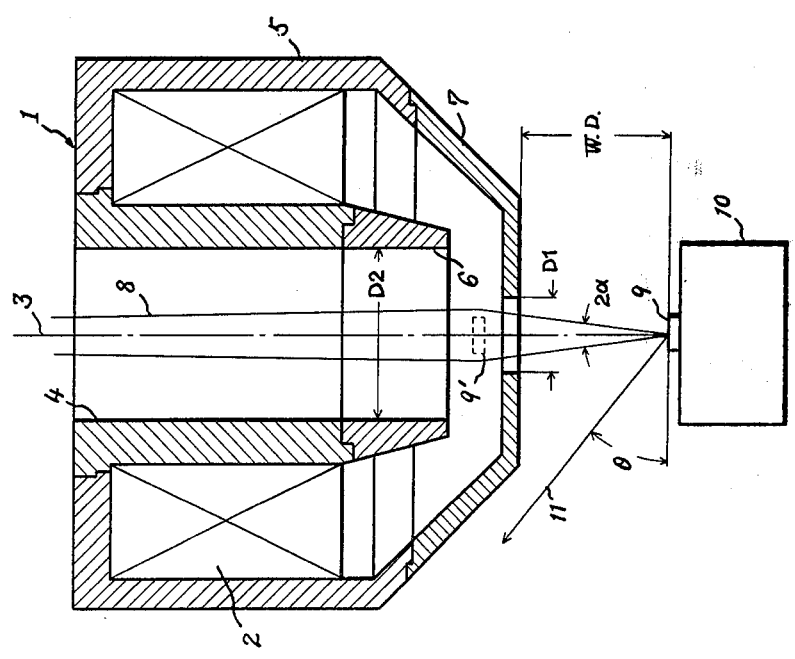
FIG. 1 is a schematic drawing showing an objective lens widely used in a conventional scanning electron microscope.
Figure 2:
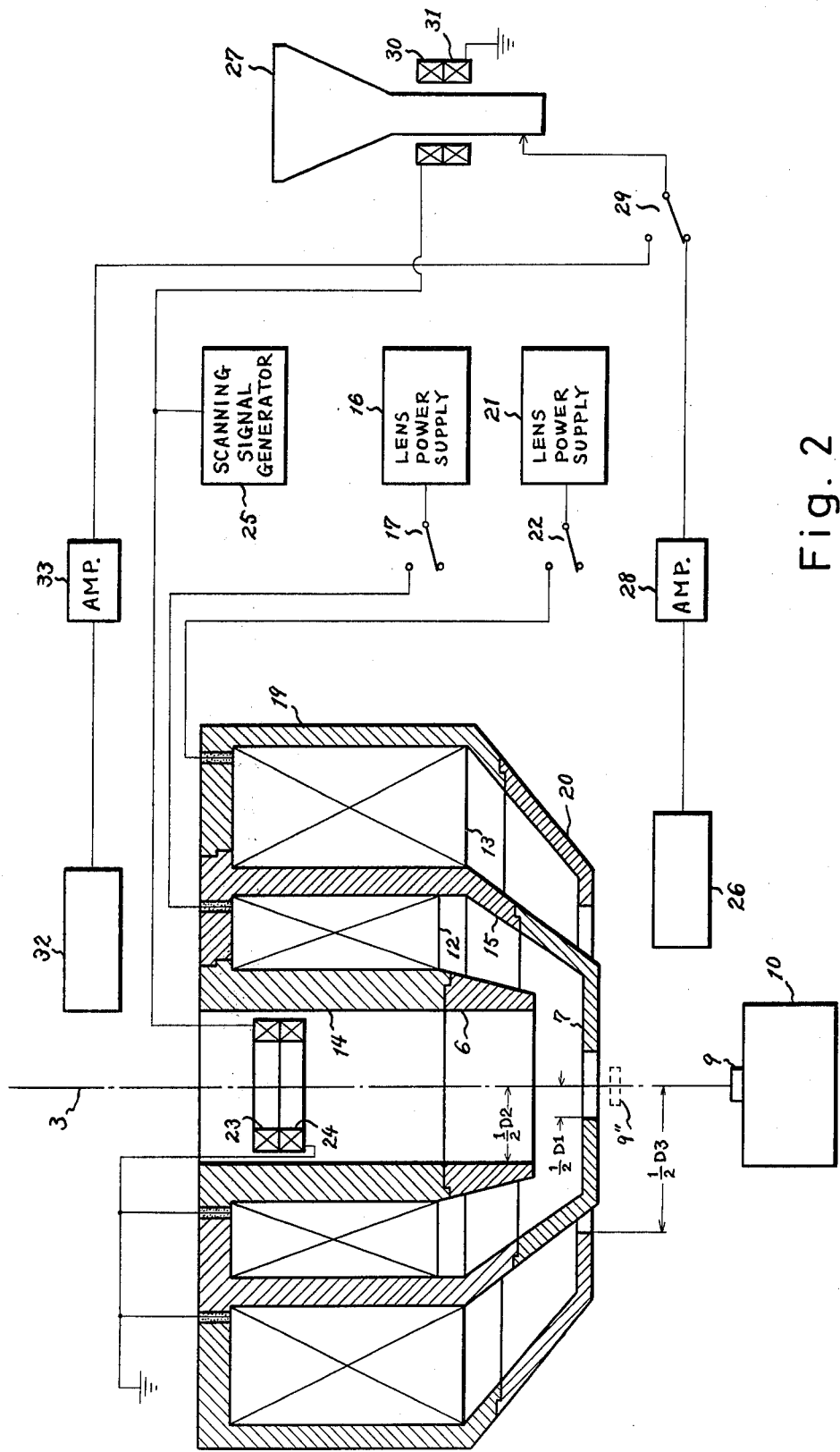
FIG. 2 is a schematic drawing of the objective lens according to this invention.

FIG. 2 shows one embodiment of an objective lens according to this invention in which the constituent parts having index numbers corresponding to those in FIG. 1 are identical in function if not in structure. In this embodiment, a first excitation coil 12 and a second excitation coil 13 are provided. An inner yoke 14 and middle yoke 14 house the first excitation coil 12. To the annular ends of yokes 14, 15 are attached the upper magnetic pole piece 6 having a bore diameter D2 and lower magnetic pole piece 7 respectively. Bore diameter D1 of lower pole piece 7, is smaller than bore diameter D2 of upper pole piece 6. When the first coil 12 is supplied with excitation current from its lens power supply 16 via a switch 17, the objective lens magnetic field is generated near the gap between the upper and lower magnetic pole pieces 6 and 7. The middle yoke 15 and outer yoke 19 house the second excitation coil 13, and to the annular ends of the yoke 19 is attached an outer magnetic pole piece 20 having a bore diameter D3 which is larger than D1. When the second excitation coil 13 is supplied with excitation current from its lens power supply 21 via a switch 22, the objective lens magnetic field is generated near the gap between the lower and outer magnetic pole pieces 7 and 20. The electron beam along the lens axis 3 is converged by said lens magnetic field on the surface of the specimen 9. Deflection coils 23 and 24 supplied with scanning signal from a scanning signal generator 25 scan the electron beam on the specimen 9.

In the case that only the first excitation coil 12 is excited (hereafter called first observation mode) and the specimen 9 is positioned at comparatively long W.D., the secondary electrons that emanated from the specimen 9 are detected by a first detecting means 26, which consists of a scintillator, photomultipler, and accelerating electrode for directing the secondary electrons toward the scintillator by generating an electrostatic field. The output signal of said detecting means 26 is supplied to a cathode-ray tube (CRT) 27 via an amplifier 28 and a changeover switch 29 as a brightness modulation signal. The deflection means 30 and 31 of the CRT 27 are supplied with signals synchronizing with the scanning electron beam from the scanning signal generator 25, so that the secondary electron image of the specimen is displayed on the screen on the CRT 27.

In the case that only the second excitation coil 13 is excited (hereafter called second observation mode) and the specimen 9 is lifted along the axis 3 to the position of the broken line 9″ shown in FIG. 2 by handling the specimen stage 10, the objective lens magnetic field near the specimen 9 acts, of course, as an objective lens for the electron beam and also acts as a focusing means for focusing secondary electrons emitted in all directions from the specimen upward and toward the direction of the lens axis 3. A second detecting means 32 having the same constituents of above said first detecting means 26 is displaced upwardly of the objective lens and detects the secondary electrons reached at the lens axis 3 near the annular end of the inner yoke 14. The output signal of the second detecting means 32 is supplied to the CRT 27 via an amplifier 33 and the changeover switch 29, so that the secondary electron image of the specimen is displayed on the screen of the CRT 27.

Figure 3:
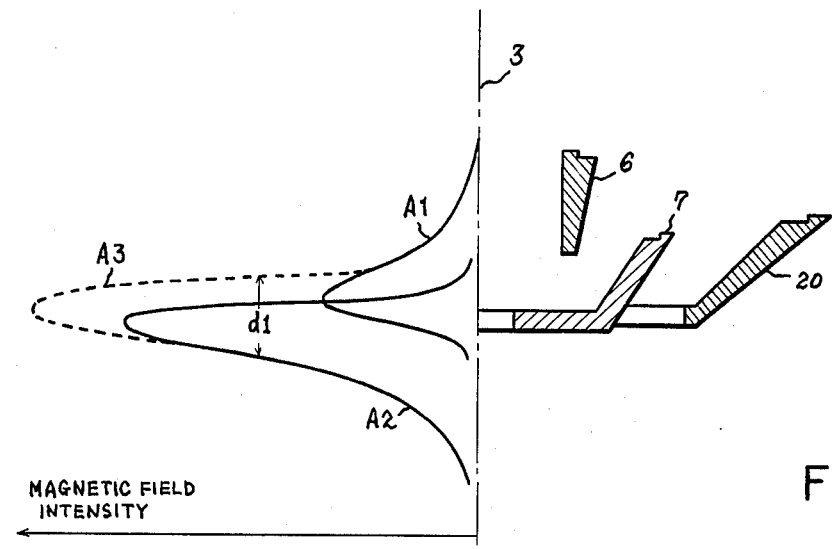
FIG. 3 is a schematic drawing showing axial magnetic field distribution in the objective lens shown in FIG. 2.

FIG. 3 shows the magnetic field distribution along the lens axis 3 near the magnetic pole pieces 6, 7 and 20. In FIG. 3, curve A1 represents the axial magnetic field distribution in the first observation mode, and curve A2 represents the axial magnetic field distribution in the second observation mode.

Figure 4:
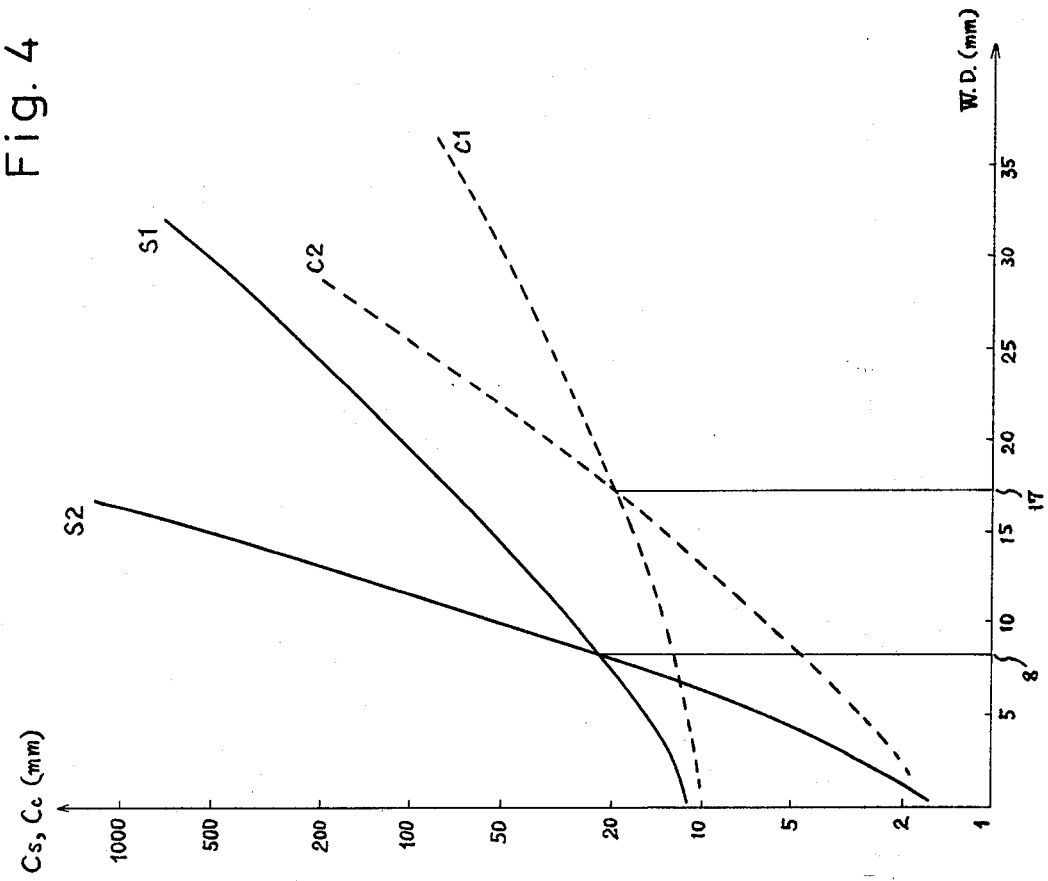
FIG. 4 is a graph showing the relation between the working distance and the spherical and chromatic aberration coefficients.

FIG. 4 is a graph showing the relation between the W.D. (mm) and the spherical and chromatic aberration coefficients Cs, Cc (mm) on the basis of the experiment using the objective lens shown in FIG. 2. In FIG. 4, the curve S1 represents the spherical aberration coefficient Cs in the first observation mode, the curve S2 represents the spherical aberration coefficient Cs in the second observation mode, the curve C1 represents the chromatic aberration coefficient Cc in the first observation mode, and the curve C2 represents the chromatic aberration coefficient in the second observation mode. The curves S1 and S2 cross each other at W.D. = 8 mm and the curves C1 and C2 cross each other at W.D. = 17 mm. By comparing the curves S1, S2, C1 and C2 in FIG. 4, the following facts become apparent.

(A) Under the condition of W.D. < 8 mm, the values of the curves S2 and C2 are smaller than those of the curves S1 and C1. Accordingly, the second observation mode is preferably in this condition for obtaining a high resolution image. And the highest resolution image is obtained by shortening the W.D. as much as possible.

(B) Under this condition of W.D. > 17 mm, the values of the curves S1 and C1 are smaller than those of the curves S2 and C2. Accordingly, the first observation mode is preferably in this condition for obtaining a high resolution image. Further, this condition is preferable for the observation of the ferromagnetic specimen. Because, in the lower region of the lower surface of the lower magnetic pole piece 7, the value of the axial magnetic field distribution curve A1 is smaller than that of the curve A2 as shown in FIG. 3.

(C) Under the condition of 8 mm $\leq$ W.D. $\leq$ 17 mm, the second observation mode is usually preferable for obtaining a high resolution image; because, the chromatic aberration does not much contribute to the image resolution as compared with the spherical aberration. However, in the special condition that, for example, the aforesaid semi-angle $\alpha$ of the electron beam is very small, the first observation mode is preferable for obtaining a high resolution image.

Incidentally, in order to increase the takeoff angle $\theta$ in aforementioned (ii) or to obtain a very low magnification image, the very long W.D. is required. In this case, it is preferable that both the first and second excitation coils 12 and 13 are excited (hereafter called third observation mode) for the following reasons. Namely, in the third observation mode, the axial magnetic field distribution curve A3 shown in FIG. 3 has a half value width d1 which is wider than that in the first or second observation mode. (The peak value of the curve A3 is lower than those of the curves A1 and A2 in actual observation.) In the condition of the very long W.D., by expanding the half value width of the axial magnetic field distribution, the spherical aberration coefficient Cs is reduced and a high resolution image is obtained.

Figure 5:
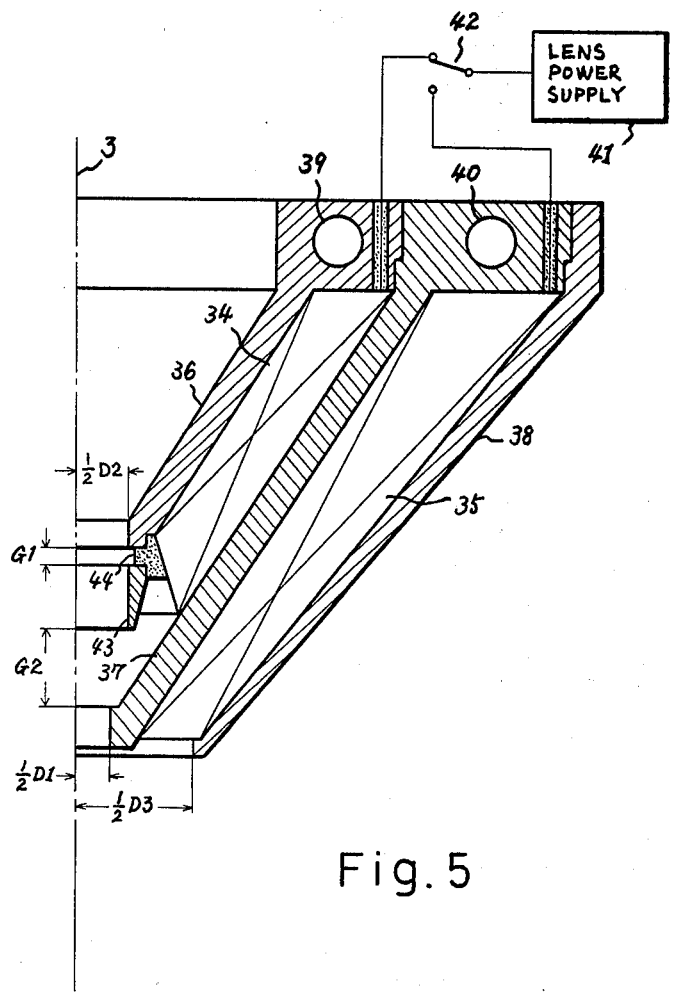
FIG. 5 is a schematic drawing showing another objective lens according to this invention.

FIG. 5 shows a practical and a cross sectional view of another embodiment according to this invention. This objective lens structure is different from the embodiment shown in FIG. 2 in the following respects.

(1) The shape of a first excitation coil 34, a second excitation coil 35, an inner yoke 36, a middle yoke 37 and an outer yoke 38 is not cylindrical but like a funnel (conical shaped).

(2) Passages 39 and 40 for passing cooled water or oil are formed in the yokes 36 and 37 so that heat generated at the excitation coils 34 and 35 is absorbed.

(3) The output current of a common lens power supply 41 is supplied to the first excitation coil 34 or the second excitation coil 35 via a changeover switch 42.

(4) Annular end portions of the yokes 36, 37 and 38 act as magnetic pole piece without separate members.

(5) The lower surface of the outer yoke (magnetic pole piece) 38 is positioned in the lower (or the same) position of the lower surface of the middle yoke (lower magnetic pole piece) 37.

(6) A supplemental magnetic pole piece 43 is attached to the annular end of the inner yoke 36 via a nonferromagnetic spacer 44.

Figure 6:
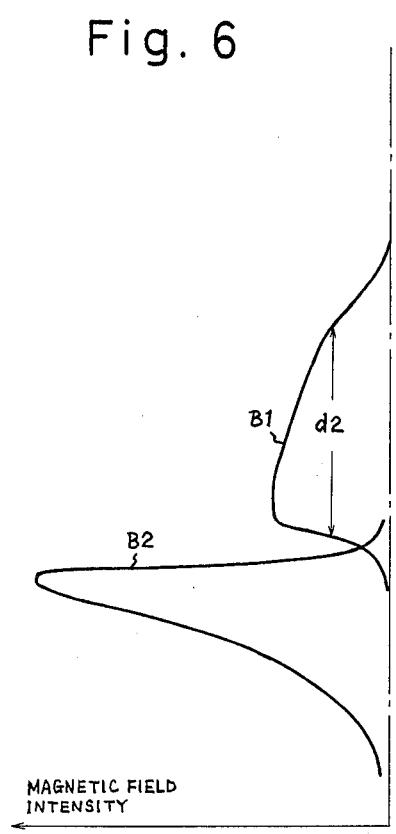
FIG. 6 is a schematic drawing showing axial magnetic field distribution in the objective lens shown in FIG. 5.

FIG. 6 shows the axial magnetic field distribution curves in the objective lens shown in FIG. 5. In FIG. 6, the curve B1 represents the distribution of the magnetic field generated in the first observation mode in which only the first excitation coil 34 is excited, and the curve B2 represents distribution of the magnetic field generated in the second observation mode in which only the second excitation 35 is excited. The half value width d2 of the curve B1 is comparatively large, because the axial magnetic field in the first observation mode is generated in double gaps G1 and G2. By so doing, the spherical aberration coefficient is reduced as aforementioned, and a high resolution scanning image is obtained in the first observation mode. (The effects of the supplemental magnetic pole piece are described more theoretically in U.S. Pat. No. 4,219,732).

Additionally, the third observation mode in which both the first and second excitation coils 34 and 35 are excited (by their own lens power supplies (not shown)) is preferable in the case where a very long W.D. is required in the embodiment shown in FIG. 5.

Having thus described the invention with the detail and particularity required by the Patent Laws, what is claimed and desired to be protected by Letters Patent is set forth in the following claims:

1. A magnetic objective lens for use in a scanning electron microscope comprising:
   (a) a lower magnetic pole piece having a bore diameter D1,
   (b) an upper magnetic pole piece having a bore diameter D2 which is larger than D1,
   (c) an outer magnetic pole piece having a bore diameter D3 which is larger than D1,
   (d) a first excitation coil for generating the magnetic field between said lower magnetic pole piece and said upper magnetic pole piece, and
   (e) a second excitation coil for generating the magnetic field between said lower magnetic pole piece and said outer magnetic pole piece.

2. A magnetic objective lens for use in a scanning electron microscope comprising:
   (a) a lower magnetic pole piece having bore diameter D1,
   (b) an upper magnetic pole piece having bore diameter D2 which is larger than D1,
   (c) an outer magnetic pole piece having bore diameter D3 which is larger than D1,
   (d) a supplemental magnetic pole piece arranged between said lower magnetic pole piece and said upper magnetic pole piece.
   (e) a first excitation coil for generating the magnetic field between said lower magnetic pole piece and said upper magnetic pole piece, and
   (f) a second excitation coil for generating the magnetic field between said lower magnetic pole piece and said outer magnetic pole piece.

3. A magnetic objective lens for use in a scanning electron microscope comprising:
   (a) a first excitation coil wound around a lens axis,
   (b) a yoke housing said first excitation coil, the two annular shaped ends of this yoke being used as a lower magnetic pole piece having diameter D1 and as an upper magnetic pole piece having diameter D2, which is larger than D1, for forming a magnetic field between said lower and upper magnetic pole pieces,
   (c) a second excitation coil wound around said yoke, and
   (d) an outer yoke housing said second excitation coil together with said yoke, the annular shaped end of this yoke being used as an outer magnetic pole piece having diameter D3, which is larger than D1, for forming the magnetic field between said lower magnetic pole piece and said outer magnetic pole piece having diameter D3, which is larger than D1.

* * * * *

UNITED STATES PATENT AND TRADEMARK OFFICE
CERTIFICATE OF CORRECTION

PATENT NO. : 4,419,581
DATED : December 6, 1983
INVENTOR(S) : Seiichi Nakagawa

It is certified that error appears in the above-identified patent and that said Letters Patent is hereby corrected as shown below:

On the title page insert Foreign Application Priority data

-- Jan. 14, 1981 (JP)     Japan          56-4108 --

Column 2, line 65, "14" should read -- 15 --
Column 3, line 35, "on" (second occurrence) should read -- of --
Column 5, line 11, after "excitation" insert -- coil --

Signed and Sealed this

Seventeenth Day of July 1984

[SEAL]

Attest:

GERALD J. MOSSINGHOFF

Attesting Officer

Commissioner of Patents and Trademarks